(12) United States Patent
Matsuo et al.

(10) Patent No.: US 10,083,714 B1
(45) Date of Patent: Sep. 25, 2018

(54) MAGNETIC DISK DEVICE, CONTROLLER, AND METHOD

(71) Applicant: KABUSHIKI KAISHA TOSHIBA, Tokyo (JP)

(72) Inventors: Takashi Matsuo, Fujisawa Kanagawa (JP); Kenji Yoshida, Kamakura Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/694,723

(22) Filed: Sep. 1, 2017

(30) Foreign Application Priority Data

Mar. 21, 2017 (JP) .................................. 2017-054867

(51) Int. Cl.
| G11B 15/14 | (2006.01) |
| G11B 5/55 | (2006.01) |
| G11B 5/187 | (2006.01) |
| G11C 11/34 | (2006.01) |
| G11B 21/08 | (2006.01) |
| G11B 5/00 | (2006.01) |

(52) U.S. Cl.
CPC .............. G11B 5/553 (2013.01); G11B 5/187 (2013.01); G11B 5/5526 (2013.01); G11B 21/083 (2013.01); G11C 11/34 (2013.01); G11B 2005/001 (2013.01)

(58) Field of Classification Search
CPC .. G11B 5/00; G11B 5/02; G11B 27/36; G11B 5/012; G11B 20/10009; G11B 5/09; G11B 2220/90; G11B 5/6005; G11B 5/59633; G11B 20/10527; G11B 2220/10814; G11B 7/0045; G11B 15/14; G11B 5/0086
USPC ......... 360/24, 31, 39, 48, 75, 64; 369/53.31, 369/47.33, 47.34
See application file for complete search history.

(56) References Cited

U.S. PATENT DOCUMENTS

| 5,732,208 A | 3/1998 | Tamura et al. |
| 5,940,853 A * | 8/1999 | Ooi ................... G11B 20/1252 235/454 |
| 6,285,632 B1 * | 9/2001 | Ueki .................. G11B 7/0079 369/53.11 |
| 6,697,913 B1 | 2/2004 | Hansen et al. |

FOREIGN PATENT DOCUMENTS

JP    H03-156523 A    7/1991

* cited by examiner

*Primary Examiner* — Nabil Hindi
(74) *Attorney, Agent, or Firm* — Patterson & Sheridan, LLP

(57) ABSTRACT

A magnetic disk device includes a magnetic disk that includes a plurality of tracks, a magnetic head for reading data from the magnetic disk, and a controller. The controller begins controlling the magnetic head to move to a second track of the plurality of tracks from a first track of the plurality of tracks before decoding of a first track signal output from the magnetic head is completed, wherein the first track signal is output from the magnetic head while the magnetic head is positioned over the first track.

20 Claims, 7 Drawing Sheets

10,083,714 B1

MAGNETIC DISK DEVICE, CONTROLLER, AND METHOD

This application is based upon and claims the benefit of priority from Japanese Patent Application No. 2017-054867, filed Mar. 21, 2017, the entire contents of which are incorporated herein by reference.

FIELD

Embodiments described herein relate generally to a magnetic disk device, a controller, and a method.

BACKGROUND

Generally, encoded data read from a magnetic disk is input to a controller and is stored in a work memory in a read/write channel. The read/write channel performs decoding processing on the data in the work memory. Data obtained by the decoding processing is transferred to a buffer memory from the work memory, and subsequently, output to a host device. In recent years, in order to improve reliability of such data, when encoding the data, a code is used with high error correction capability, for example, a low density parity check (LDPC) code. Therefore, a decoding processing time increases, particularly due to the increased error correction time associated with decoding such an encoding scheme.

At the time of data reading or data writing, in order to seek the head to a target track and position the head over the target track, or to perform encoding/decoding processing, information including a cylinder number, the number of sectors in the track, and a clock frequency are necessary. Such information is stored on the disk in advance. Before reading data in a certain track, the controller reads this information from the disk and writes the information into an internal memory such as a register. It is necessary for the controller to hold this information in the internal memory until the encoding/decoding processing for the data in the track is finished.

DETAILED DESCRIPTION

Figure 1:
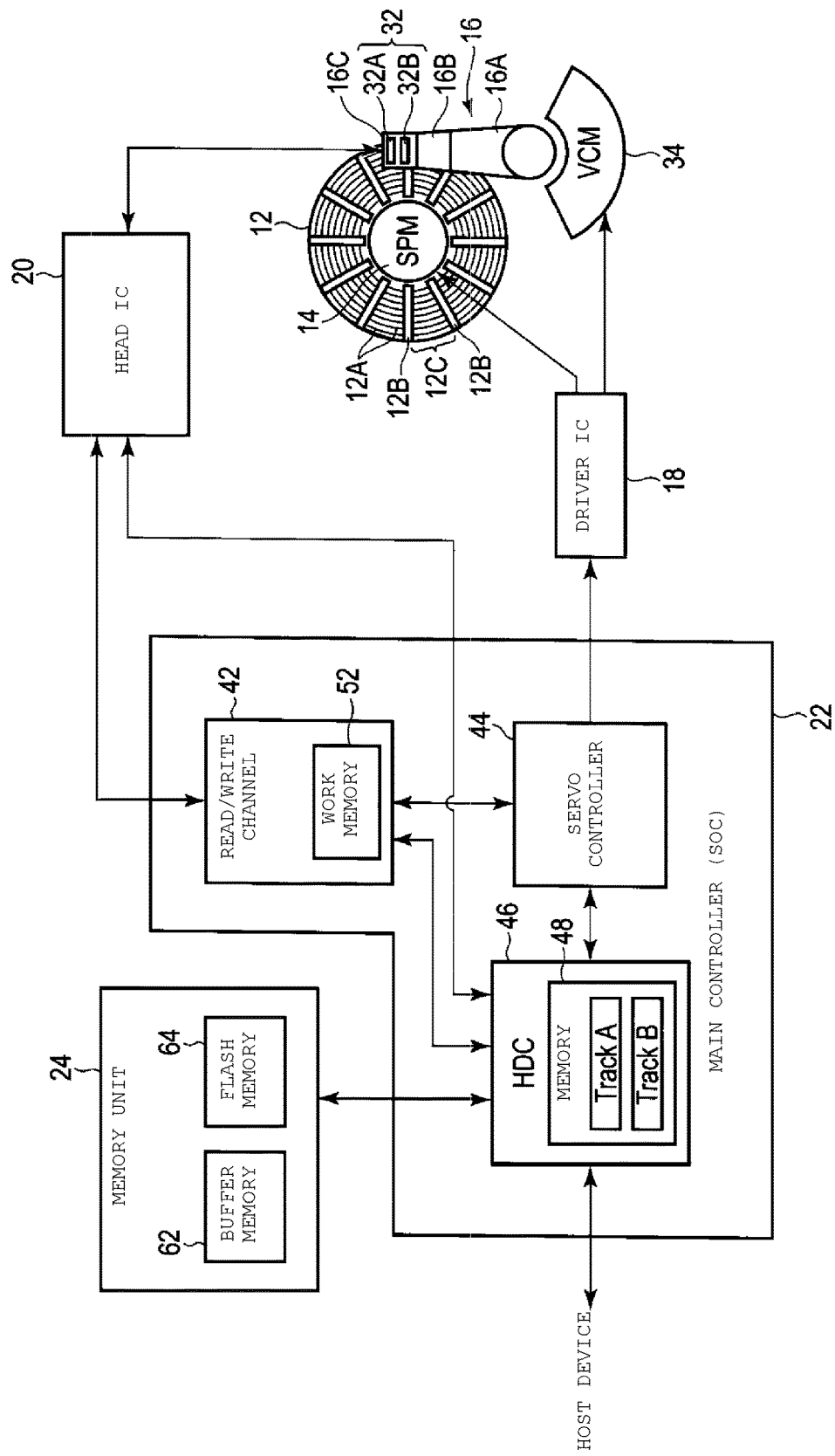
FIG. 1 is a schematic illustration of an example configuration of a magnetic disk device in exemplary embodiments.

Embodiments provide a magnetic disk device, a controller, and a method capable of successively accessing a plurality of tracks.

In general, according to one exemplary embodiment, a magnetic disk device includes a magnetic disk that includes a plurality of tracks, a magnetic head for reading data from the magnetic disk, and a controller. The controller begins controlling the magnetic head to move to a second track of the plurality of tracks from a first track of the plurality of tracks before decoding of a first track signal output from the magnetic head is completed, wherein the first track signal is output from the magnetic head while the magnetic head is positioned over the first track.

Hereinafter, exemplary embodiments will be described referring to the drawings. The disclosure is merely an example, and the disclosure is not limited by the content in the exemplary embodiments described below. Naturally, modifications that can be easily conceived by those skilled in the art are included in the scope of the disclosure. For clarity of description, in some cases in the drawings the size, shape, and the like of each element may be schematically illustrated and are not necessarily to scale. In some drawings, the same reference numbers will be given to corresponding elements, and the detailed description thereof will be omitted.

Schematic Configuration

FIG. 1 is a block diagram illustrating a typical configuration example of a magnetic disk device (also referred to as a hard disk drive) in the exemplary embodiments. The magnetic disk device includes a magnetic disk (hereinafter, simply referred to as a disk) 12, a spindle motor (SPM) 14, an actuator 16, a driver integrated circuit (IC) 18, a head IC 20, a main controller 22, a voice coil motor (VCM) 34, and the like. The main controller 22 is connected to a host device (not illustrated).

The disk 12 is a magnetic recording medium and has, for example, write surfaces on both sides thereof on which the data is magnetically recorded. The disk 12 is rotated at a high speed by the spindle motor 14. The spindle motor 14 is driven by a current or a voltage supplied from the driver IC 18.

The write surfaces on the disk 12 include a plurality of tracks 12A. The tracks 12A may be a plurality of concentric tracks or may be a single spiral track. The disk 12 also includes a plurality of servo areas 12B radially formed in a radial direction. The plurality of servo areas 12B are discretely arranged at equal circumferential intervals. Each track 12A between servo areas 12B adjacent to each other in the circumferential direction is used as data area 12C. The servo area 12B in each track 12A is also referred to as a servo frame. An area that includes a servo area 12B in each track 12A and a data area 12C adjacent to the servo area 12B is also referred to collectively as a servo sector. The data areas 12C include a plurality of data sectors having a constant size, for example, 512 bytes.

Servo data is written in the servo area 12B. The servo data includes a track number, a sector number, and burst data. The sector number is a number that specifies the servo sector, and the burst data indicates a relative position of the head with respect to a center of the track.

A write head 32A and a read head 32B are disposed adjacent to a corresponding write surface of the disk 12. The write head 32A and the read head 32B are collectively referred to herein as simply a head 32. FIG. 1 illustrates the write head 32A and the read head 32B that correspond to the write surface on one side of the disk 12. A write head and a read head can be similarly disposed adjacent to the write surface on the other side of the disk 12. The write head 32A and the read head 32B are attached to a slider 16C which is attached to a tip end of the suspension 16B that is extended from an arm 16A of the actuator 16. The actuator 16 is driven by the voice coil motor 34. The voice coil motor 34 is driven by a current or a voltage supplied from the driver IC 18. Rotation of the actuator 16 moves the write head 32A and the read head 32B relative to the disk 12 in the radial direction so as to draw an arc and to be positioned at a target track.

FIG. 1 illustrates a magnetic disk device including one disk 12, but the magnetic disk device in the exemplary embodiments may include a plurality of stacked disks and a plurality of corresponding heads disposed proximate the plurality of disks, respectively. In embodiments in which a plurality of double sided disks with write surfaces on both sides thereof, the number of heads is twice the number of disks, and the heads are disposed on both sides of the plurality of disks. Since one head corresponds to a respective write surface, each write surface can be represented by a head number. When a plurality of double sided disks are stacked, a position of an particular data sector is designated by cylinder-head-sector (CHS) information. A set of tracks having the same radius on each write surface is referred to as a cylinder. A cylinder number C indicates a position in the radial direction of the disk, and corresponds to the track in which the data sector is provided. A head number H indicates a sequential number of the write surface on which the data sector is positioned. A sector number S indicates a sequential number of a servo sector in the track in which the data sector is positioned. Generally, a cylinder on the outmost periphery is cylinder 0, a head on the uppermost surface is head 0, a first servo sector of a track is sector 1, and the numbers are subsequently allocated in order.

The driver IC 18 drives the spindle motor 14 and the voice coil motor 34 in response to a control signal by a servo controller 44 in the main controller 22. The head IC 20 is also called a head amplifier, and includes a variable gain amplifier that amplifies an output signal from the read head 32B (referred to as a read signal). The head IC 20 converts the write data output from the main controller 22 (specifically, the read/write channel 42 in the main controller 22) into a write current, and outputs the write current to the write head 32A.

The main controller 22 is implemented as a system Large scale integration IC called a system on a chip (SoC) in which a plurality of elements are integrated into a single chip. The main controller 22 includes the read/write channel 42, a hard disk controller (HDC) 46, and the servo controller 44. A memory unit 24 with semiconductor memory such as a buffer memory 62 or a flash memory 64 configured with an SDRAM or the like is provided external to the main controller 22.

The read/write channel 42 processes the signal supplied to the head IC 20 or the signal supplied from the head IC 20. The read/write channel 42 includes a work memory 52 configured with an SRAM in which the data is temporarily stored for coding/decoding. During a write process, the hard disk controller 46 writes the user data transferred from the host device into the buffer memory 62, divides the user data into sector data having a constant size, for example, 512 bytes, adds a cyclic redundancy check (CRC) code for each sector data, and transfers the sector data to which the CRC is added to the work memory 52 in the read/write channel 42. The hard disk controller 46 causes the data transferred from the read/write channel 42 to include CHS information. The CHS information may be added to the sector data or may be included in the CRC code by an EXOR operation. The read/write channel 42 encodes the sector data in the work memory 52 using an error correction code such as an LDPC code. The encoded data is transferred to the head IC 20 and is written into the disk 12 by the write head 32A.

During a read process, the read/write channel 42 converts analog data into digital data, and stores the digital data in the work memory 52. The analog data is based on the output signal of the read head 32B supplied from the head IC 20. The read/write channel 42 performs a decoding process on the digital data stored in the work memory 52. The read/write channel 42 performs the decoding process based on the error correction code, and repeats the decoding process until it is determined that the correct decoding result is obtained. When it is determined that the correct decoding result is obtained, the read/write channel 42 transfers the data obtained by the decoding process to the hard disk controller 46 from the work memory 52. The hard disk controller 46 checks the data obtained by the decoding process based on the CRC code. When it is determined that there is an error based on the CRC code, the hard disk controller 46 instructs the read/write channel 42 to retry to read. When it is determined that there is no error, the hard disk controller 46 transfers the data transferred from the work memory 52 to the buffer memory 62. The hard disk controller 46 transfers the data in the buffer memory 62 to the host device as appropriate.

The hard disk controller 46 is connected to the host device via a host interface. The host device can use the magnetic disk device as its own storage device. The host device and the magnetic disk device are included in, for example, an electronic device such as a personal computer, a video camera, a music player, a mobile terminal, a mobile phone, or a printer device. The hard disk controller 46 functions as a host interface controller that transfers a signal to the host device and receives a signal transferred from the host device. Specifically, the hard disk controller 46 receives commands (e.g., a write command, a read command, or the like) transferred from the host device. The hard disk controller 46 controls the data transfer between the host device and the memory unit 24. The hard disk controller 46 functions as a disk interface controller that controls the data written to the disk 12 and the data read from the disk 12 via the read/write channel 42, the head IC 20, and the write head 32A, read head 32B.

The servo controller 44 controls the spindle motor 14 and the voice coil motor 34 via the driver IC 18. In order to position the head 32 at a target position on the target track in the disk 12, the servo controller 44 controls the voice coil motor 34 based on the servo data extracted by the read/write channel 42. Controlling the voice coil motor 34 is equivalent to controlling the rotation angle of the actuator 16.

The read/write channel 42, the hard disk controller 46, and the servo controller 44 each respectively include a microprocessor unit (MPU) (not illustrated). The MPUs implement the functions of the read/write channel 42, the hard disk controller 46, and the servo controller 44, respectively, by executing each of the control programs for the read/write channel 42, the hard disk controller 46, and the servo controller 44. In cooperation with the MPUs, the read/write channel 42, the servo controller 44, and the hard disk controller 46 are controlled to cooperate with each other. The control programs are stored in the flash memory 64. A single MPU may execute the control program on a time sharing basis. The hard disk controller 46 includes a memory 48 configured with SRAM that stores track-related information described below. The memory 48 includes an area Track A and an area Track B in which the track-related information for two tracks is stored.

The memory unit 24 includes the buffer memory 62 and the flash memory 64. The flash memory 64 is a rewritable nonvolatile semiconductor memory, and a control program (e.g., firmware) for implementing the functions of the main controller 22 (including the hard disk controller 46 and the servo controller 44) is stored in advance in flash memory 64. A correspondence table (for example, an address conversion table) between a logical address and a physical address, and information on defect sectors (e.g., physical addresses indicating defective sectors, or the like) are also stored in part of the storage area in the flash memory 64. At least a part of the storage area in the buffer memory 62 is established as a work area for the hard disk controller 46 and the servo controller 44. The read data decoded by the read/write channel 42 is transferred to the buffer memory 62 to be temporarily stored in the buffer memory 62, and then transmitted to the host device. The write data transmitted from the host device is temporarily stored in the buffer memory 62, and then transferred to the read/write channel 42. In FIG. 1, the memory unit 24 is connected to the main controller 22 as a separate device, but may be incorporated in the main controller 22.

Reading Operation

The reading operation of the magnetic disk device in the first exemplary embodiment will be described referring to a flowchart in FIG. 2. When a power source supplied to the magnetic disk device is turned ON, the hard disk controller 46 reads track-related information relating to a track format of each track from the disk 12 and writes the information into the buffer memory 62 in S12. The track-related information includes CHS information on each sector, a sector number of the first data sector in each servo sector, a position of the second data sector in each servo sector, a standard sector length of the sector in each servo sector, the number of data sectors in each servo sector, a skew setting value, a defective sector table, and clock information. When arranging the data sectors in the track, the physical arrangement position of each data sector is determined based on the track related information. The track-related information is information for each track, and the track-related information for all the tracks is transferred to the buffer memory 62 from the disk 12 in S12.

In S14, a read command is input to the hard disk controller 46 from the host device. The read command includes an address (also referred to as an LBA) of a read start sector and an address range (such as an LBA length). The LBA (logical block address) included in the read command is converted to the CHS information based on an address conversion table.

In S16, the hard disk controller 46 reads the track-related information on the track (which is the read start track (referred to as a track i)) for the read start sector, from the buffer memory 62 and writes the information into the first area Track A in the memory 48.

In S18, the servo controller 44 supplies a seek current or voltage (based on a difference between the current position of the head 32 and the position of the read start sector) to the voice coil motor 34, and performs positioning of the head 32 (also known as seeking) at the position of the read start sector. The position of read start sector is based on the CHS information in the track-related information stored in the first area Track A in the memory 48. The voice coil motor 34 rotates according to the seek current or voltage and moves the head 32 to the read start track.

In S22, the read/write channel 42 starts to read the encoded sector data in track i from the disk 12. First, the read/write channel 42 reads the first data (which is encoded sector data) which includes the read start sector from the disk 12, and writes the encoded sector data read from the read start sector into the work memory 52. When writing of the first encoded sector data into the work memory 52 is finished, the read/write channel 42 continues to sequentially read the encoded sector data of the second and subsequent sectors from the disk 12 and sequentially write the encoded sector data into the work memory 52.

When the writing of the first encoded sector data into the work memory 52 is finished, in S23, the read/write channel 42 starts the decoding process on the encoded sector data in the work memory 52. First, the read/write channel 42 performs the decoding process on the first encoded sector data in the work memory 52. One method of encoding the data written into the disk 12, for example, employees a low density parity check (LDPC) code having high error correction ability. The encoding is performed on a per sector basis, but encoding on a track basis may also be used. The encoding on a per sector basis is performed by adding an error correction code (ECC) bit to the original sector data, while encoding on a per track basis is performed by adding a parity sector in each track to the sector data in the place of the sector data. When encoding on a per track basis is performed, the read/write channel 42 first performs the decoding processing on a per sector basis based on the sector ECC. If the correct decoding result cannot be obtained by the decoding processing on a per sector basis, the read/write channel 42 then obtains the sector data by performing the decoding process on a per track basis based on the parity sector.

The read/write channel 42 sends the sector data obtained by the decoding processing to the hard disk controller 46. In S24, the hard disk controller 46 checks the sector data from the read/write channel 42 based on the CRC code. In a case where there is an error, the hard disk controller 46 instructs the read/write channel 42 to retry to read. In a case where there is no error, the hard disk controller 46 transfers the sector data received from the read/write channel 42 to the buffer memory 62. When the sector data obtained by performing the decoding processing on the first encoded sector data is transferred to the hard disk controller 46, the read/write channel 42 sequentially performs the decoding process on the encoded sector data from the second and subsequent sectors, and transfers the sector data obtained by the decoding process to the hard disk controller 46. The sector data transferred to the buffer memory 62 is transferred to the host device at a time when it is possible to communicate with the host device.

In S26, the read/write channel 42 determines whether or not all the encoded sector data in the track i to be read are read from the disk 12 and written to the work memory 52. If No (NO in S26), the process pauses in S26 while the operations of S22, S23, and S24 continue to completion, including reading the encoded sector data in track i and transferring the data to the work memory 52 in S22, performing the decoding processing in S23, and transferring the sector data to the hard disk controller 46 and the buffer memory 52 in S24.

When all the encoded sector data in the track i to be read are read from the disk 12 and written to the work memory 52 (YES in S26), the hard disk controller 46 determines whether or not reading of all the data designated by the read command is finished in S28, specifically, all of the data referenced by the LBA length included in the read command. That is, the hard disk controller 46 determines whether or not the LBA length designated by the read command extends over multiple tracks. When the LBA length extends over a plurality of tracks, the hard disk controller 46 determines whether or not a track is present that includes unread encoded sector data that is designated to be read in the read command. When the reading is finished (YES in S28), that is, when the LBA length designated by the read command does not extend over multiple tracks or when no unread tracks are present even though the LBA length designated by the read command extends over multiple tracks, the operation ends while waiting for completion of the transfer of all the sector data read from the track i to the buffer memory 62. When the reading is not finished (NO in S28), in S32, the hard disk controller 46 reads the track-related information for the next track, i.e., the track (i+1), from the buffer memory 62 and writes the information into the second area Track B in the memory 48. It is noted that Track A and Track B in the memory 48 represent different regions of the memory 48, and can be updated or overwritten with new data independently from each other.

In S34, the servo controller 44 supplies the seek current or voltage (based on a difference between the current position of the head 32 and the position of the read start sector of the next track (i+1)) to the voice coil motor 34, and performs positioning of the head 32 to the position of the first sector in the next track (i+1).

In S38, the read/write channel 42 starts to read the encoded sector data stored in the track (i+1) from the disk 12.
First, the read/write channel 42 reads the first encoded sector data in the track (i+1) from the disk 12 and writes the encoded sector data read from the track (i+1) into the work memory 52. When writing of the first encoded sector data into the work memory 52 is finished, the read/write channel 42 continues to sequentially read the encoded sector data stored in the second and subsequent sectors from the disk 12, and sequentially writes the encoded sector data that has been read into the work memory 52.

Similar to S23, when writing of the first encoded sector data into the work memory 52 is finished, in S39 the read/write channel 42 starts to perform the decoding process on the encoded sector data in the work memory 52. First, the read/write channel 42 performs the decoding processing on the first encoded sector data in the work memory 52. When the ECC bit is added during encoding not only on a per sector basis but also on a per track basis, the decoding process is performed on the encoded sector data on both a per sector basis and on a per track basis. The decoding process on a per track basis is performed after the encoded sector data items for all of one track are written into the work memory 52.

The read/write channel 42 sends the sector data obtained by the decoding process to the hard disk controller 46. In S42, the hard disk controller 46 checks the sector data, i.e. the decoding result that is sent from the read/write channel 42, based on the CRC code. In a case where there is an error, the hard disk controller 46 instructs the read/write channel 42 to retry to read. In a case where there is no error, the hard disk controller 46 transfers the sector data received from the read/write channel 42 to the buffer memory 62. When the sector data obtained by performing the decoding process on the first encoded sector data is transferred to the hard disk controller 46, the read/write channel 42 sequentially performs the decoding process on the second and subsequent encoded sector data and transfers the sector data obtained by the decoding process to the hard disk controller 46.

In S44, the read/write channel 42 determines whether or not all the encoded sector data in the track (i+1) to be read have been read from the disk 12 and written to the work memory 52. If No (NO in S44), the process pauses in S44, while the operations of S38, S39, and S42 continue to completion, including reading the encoded sector data in track (i+1) and transferring the data to the work memory 52 in S38, performing the decoding processing in S39, and transferring the sector data to the hard disk controller 46 and the buffer memory 52 in S42.

When all the encoded sector data in the track (i+1) to be read are read from the disk 12 and written to the work memory 52 (YES in S44), in S46 similarly to S28, the hard disk controller 46 determines whether or not reading of all the data designated by the read command is finished, specifically, all of the data referenced by the LBA length included in the read command. If the reading is finished (YES in S46), the operation ends while waiting for the completion of the transfer of the sector data from the track (i+1) to the buffer memory 62.

If the reading is not finished (NO in S46), that is, when it is necessary to read sector data stored in a third track, the hard disk controller 46 increases the variable i by two (i←i+2) in S48, and then, the process proceeds to S52. In S52, the hard disk controller 46 reads the track-related information for the track i (i.e., the third track) from the buffer memory 62 and writes the information into the first area Track A in the memory 48. In S54, the servo controller 44 performs positioning of the head 32 to the position of the first sector in the next track I (now the third track). The main controller 22 then repeats the process steps beginning at S22.
Successive Reading By the process described above, the magnetic disk device in the exemplary embodiments can successively read data from a first track and then a second track adjacent to the first track, and can transmit the data so read to the host device. The memory 48 in the hard disk controller 46 in the main controller 22 includes the area Track A and the area Track B that each store the track-related information for a different one of the first track and the second track.

Figure 3:
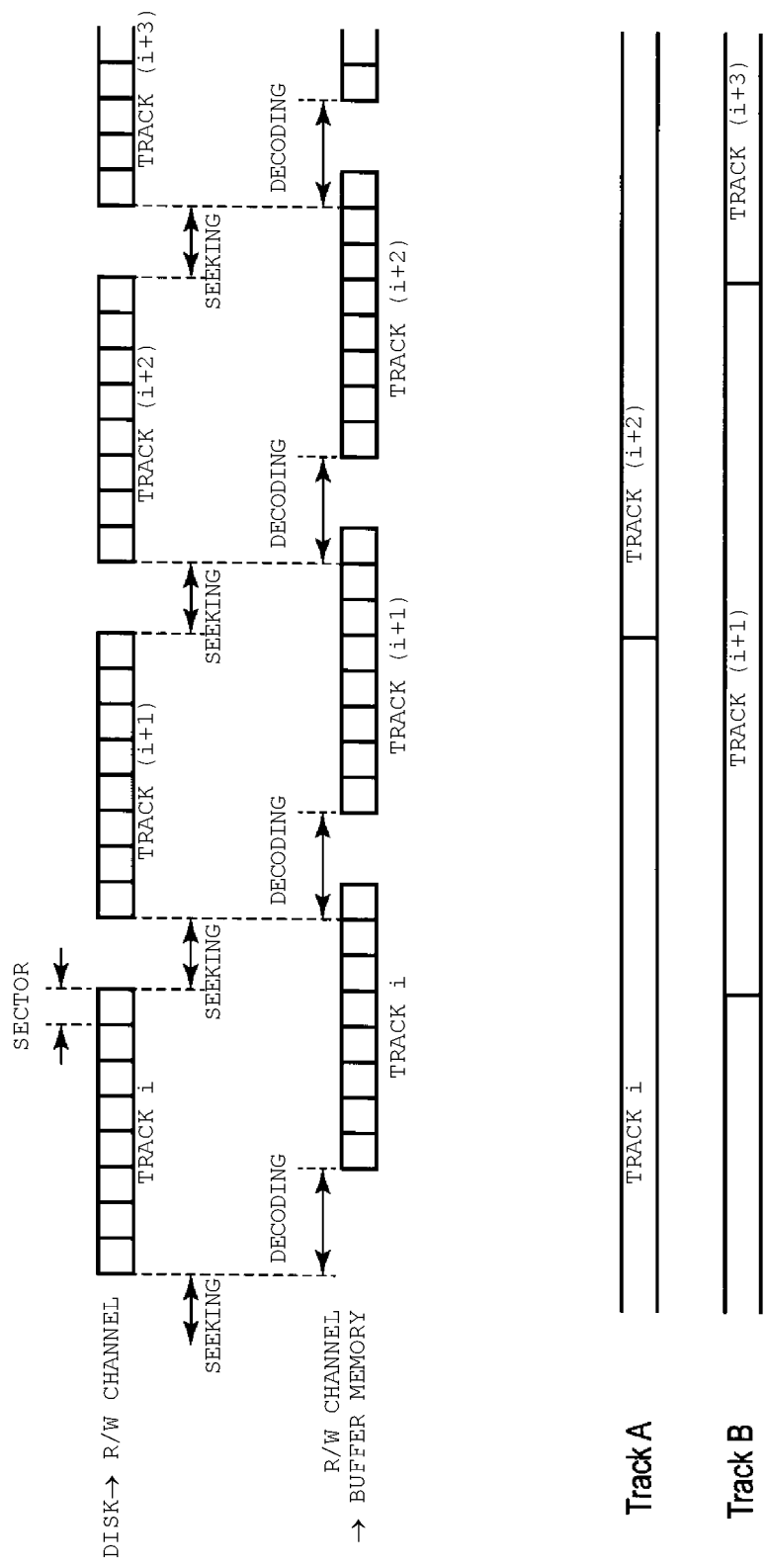
FIG. 3 is a timing chart schematically illustrating an example of successive reads of a plurality of tracks.

FIG. 3 illustrates, with respect to time (where time progresses from left to right), the encoded sector data transferred to the work memory 52 in the read/write channel 42 from the disk 12, the sector data transferred to the buffer memory 62 from the work memory 52 in the read/write channel 42, and a state of the track-related information stored in the area Track A and the area Track B in the memory 48 in the hard disk controller 46. The CHS information, the CRC code, and the ECC are added to the encoded sector data transferred to the work memory 52 from the disk 12. The CHS information and the CRC code are added to the sector data transferred to the buffer memory 62 from the work memory 52.

Figure 2:
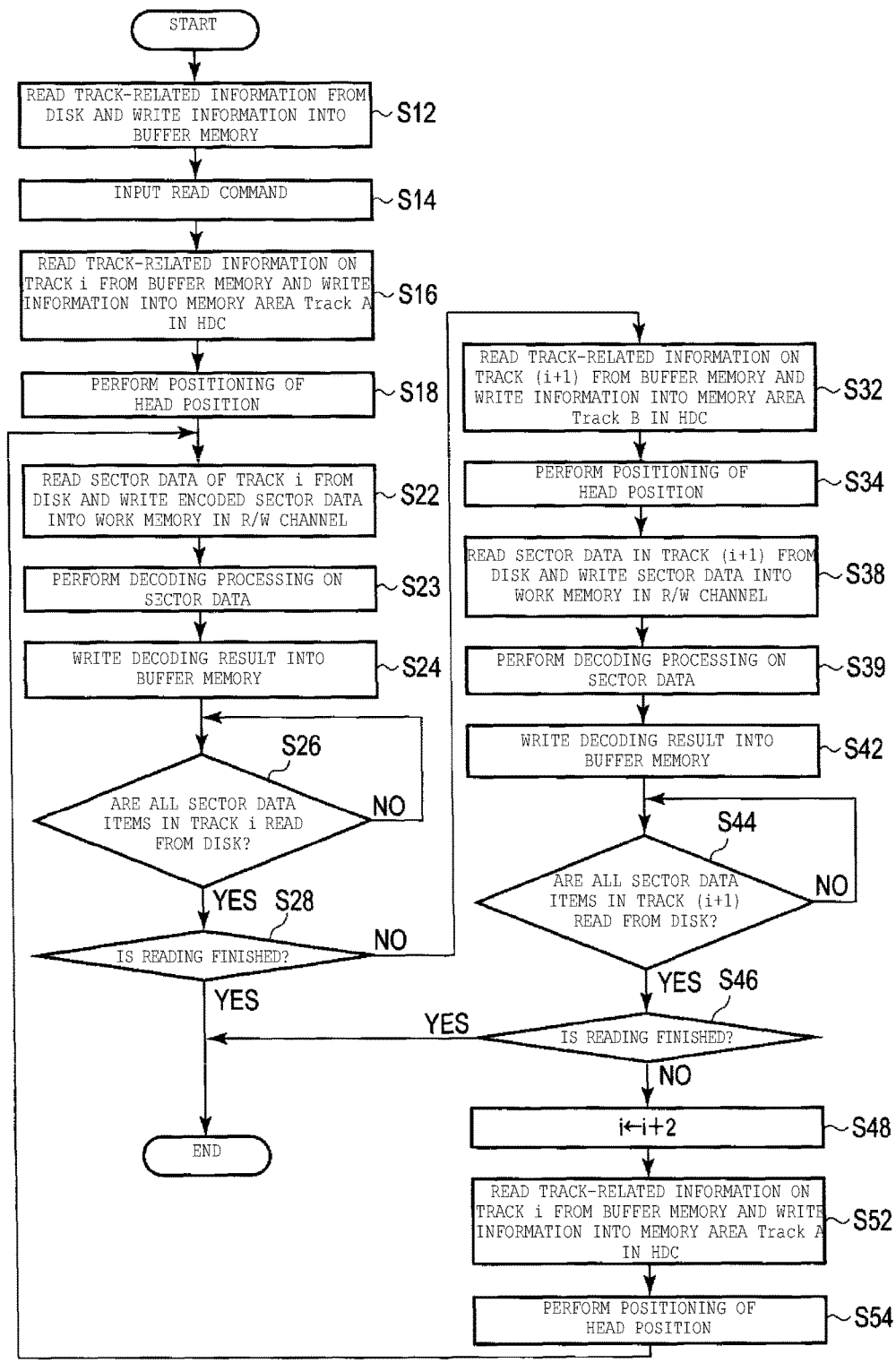
FIG. 2 is a flowchart illustrating an example of a reading operation of the magnetic disk device in a first exemplary embodiment.

In S16 in FIG. 2, the track-related information on the track i (which is the read start track) is written into the area Track A in the memory 48. The head 32 is positioned at the track i based on the track-related information in S18, and the encoded sector data in the track i is sequentially read from the disk 12 and written into the work memory 52 in S22. The decoding process is performed on the encoded sector data in the track i in S23. In S24, the decoding result, i.e., the encoded sector data that has been read and decoded, is transferred to the hard disk controller 46, which checks the CRC. When there is an error, the encoded sector data in that sector is read again from the disk 12, and the encoded sector data read from that sector is written into the work memory 52. When there is no error, the decoding result, i.e., the encoded sector data that has been read and decoded, is transferred to the buffer memory 62 from the work memory 52. FIG. 3 illustrates a scenario in which no error is detected by the CRC checking.

When a certain time has elapsed after the first encoded sector data in the track i is transferred to the work memory 52 from the disk 12, the sector data from the track i obtained by the decoding process begins to be sequentially transferred to the buffer memory 62 from the work memory 52. The time that has elapsed is that time required for the completion of the decoding process for the first encoded sector data in the track i, and is indicated in FIG. 3 with an arrow denoted "decoding."

When all the encoded sector data to be read in the track i are transferred to the work memory 52 from the disk 12, the track-related information for the track (i+1) is written into the area Track B in S32, and seeking of the head 32 to the track (i+1) is started in S34. It is noted that even when the sector data in the track i obtained by the decoding process is being transferred to the buffer memory 62 from the work memory 52, the track-related information for the track (i+1) is written into the area Track B in S32.

When seeking of the head 32 to the track (i+1) is finished, even if the sector data in the track i obtained by the decoding process is still being transferred to the buffer memory 62 from the work memory 52, the encoded sector data stored in the track (i+1) are sequentially read from the disk 12 and sequentially written into the work memory 52 in S38. In S39, the decoding process is performed on the encoded sector data in the track (i+1). In S42, the decoding result i.e., decoded sector data read from the track (i+1), is transferred to the buffer memory from the work memory 52. When a certain time has elapsed after the first encoded sector data in the track (i+1) is transferred to the work memory 52 from the disk 12, the sector data from in the track (i+1) obtained by the decoding process begins to be sequentially transferred to the buffer memory 62 from the work memory 52. The time that has elapsed is that time required for completion of the decoding process for the first encoded sector data in the track (i+1), and is indicated in FIG. 3 with another arrow denoted "decoding."

When all the encoded sector data items to be read in the track (i+1) are transferred to the work memory 52 from the disk 12, the track-related information for the track (i+2) is written into the area Track A in S52, and seeking of the head 32 to the track (i+2) is started in S54. It is noted that even if the sector data in the track (i+1) obtained by the decoding process is being transferred to the buffer memory 62 from the work memory 52, the track-related information for the track (i+2) is written into the area Track A in S52, and seeking of the head 32 to the track (i+2) is started in S54.

More generally, when all the encoded sector data in each track j is transferred to the work memory 52 from the disk 12, the track-related information for the next track (j+1) is written into one area Track in the memory 48 in which the track-related information for an immediately preceding track is stored. That is, the track-related information for the next track (j+1) overwrites the track-related information for the track (j−1), which is the track that immediately precedes the track j. Thus, during the process of writing the track-related information for the next track (j+1) into one area Track in the memory 48, the track-related information for the track j is stored in the other area Track in the memory 48. Therefore, during a period in which the decoded sector data for one track is transferred to the buffer memory 62 from the work memory 52, the seeking of the head 32 to the next track can be started. As a result, the successive reading of sector data from a plurality of tracks can be performed with high efficiency.

Figure 4:
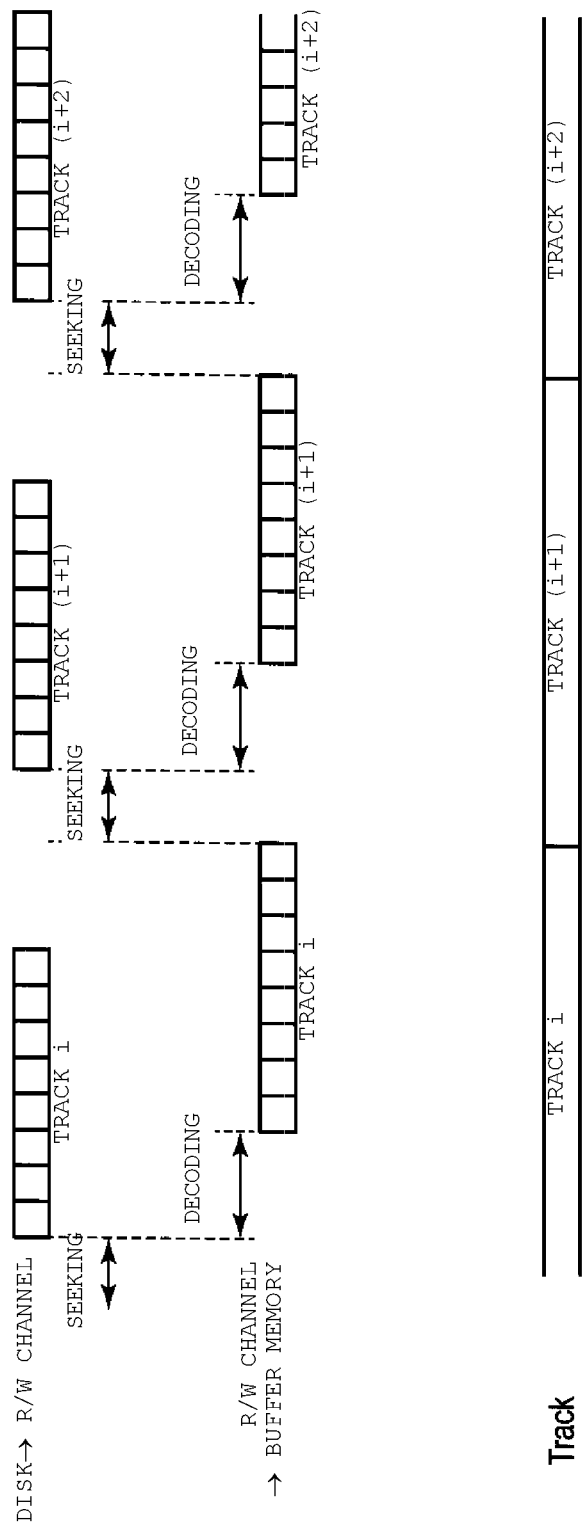
FIG. 4 is a timing chart illustrating a comparison of successive reads from a plurality of tracks.

By way of comparison, the successive reading of sector data from a plurality of tracks and storing in memory 48 in the hard disk controller, where the hard disk controller 46 stores the track related-information on one track in the memory 48 will be described in reference to FIG. 4.

The track-related information is written into the area Track in the memory 48 at a time before the track i begins to be read. The encoded sector data in the track i are sequentially read from the disk 12 based on the track-related information in the area Track in the memory 48, and are sequentially written into the work memory 52 in the read/write channel 42. When the encoded sector data in the track i are sequentially decoded, the decoded sector data in the track i obtained by the decoding process are sequentially transferred to the buffer memory from the work memory 52. However, before the sequential transfer to the buffer memory 62 of the decoded sector data can begin, a time interval elapses after the first encoded sector data in the track i is transferred to the work memory 52 from the disk 12. This time interval is a time interval required for the decoding process to be completed for the first encoded sector data read from the track i.

When transfer is completed of the sector data from the track i (obtained by the decoding process) to the buffer memory 62 from the work memory 52, the track-related information for the track (i+1) is then written into the area Track in the memory 48, and seeking the head 32 to the track (i+1) is started. When seeking the head 32 to the track (i+1) is finished, the encoded sector data stored in the track (i+1) is sequentially read from the disk 12 and is sequentially written into the work memory 52 in the read/write channel 42.

More generally, when all the sector data items for one track obtained by the decoding process is transferred to the buffer memory 62 from the work memory 52, the track related-information on the area Track in the memory 48 is updated, and seeking to the next track can be performed, followed by reading of the encoded data in the next track.

As described above, when there is only one track area in the memory 48 for storing the track-related information, seeking the head 32 to the next track is not started until all the sector data for one track is read, decoded by the decoding process, and then transferred to the buffer memory 62 from the work memory 52. Thus, the successive reading speed when extended over multiple tracks is significantly less than in the embodiments described herein.

However, in the exemplary embodiments, since there are two track areas in the memory 48 for storing the track-related information, there is no need to wait until all the sector data items for one track obtained by the decoding processing are transferred to the buffer memory from the work memory 52 before starting to seek the head 32 to the next track. That is, at the point in time point at which all the encoded sector data for one track are written into the work memory 52 from the disk 12, seeking to the next track can be started, and thus, the successive reading speed when extended over multiple tracks can be improved.

Writing Operation

Successively accessing the disk for writing that extends over multiple tracks includes similar operations to those employed for reading as described above. The writing operation of the magnetic disk device in the first exemplary embodiment will be described in reference to a flowchart in FIG. 5. When the power source supplied to the magnetic disk device is turned ON, the main controller 22 reads track-related information for each track from the disk 12 and writes the information into the buffer memory 62 in S112.

In S114, a write command is input to the main controller 22 from the host device. The write command includes the address (also referred to as an LBA) of the write start sector and the address range (such as an LBA length). The LBA included in the write command is converted to the CHS information, for example based on ad address conversion table.

In S116, the hard disk controller 46 writes the write data into the buffer memory 62. The write data is configured with sector data for storage in one or more sectors.

In S118, the hard disk controller 46 reads the track-related information for the write start track (referred to as track i) and for the next track (referred to as track (i+1)) from the buffer memory 62, and respectively writes the track-related information for each into the first area Track A and the second area Track B in the memory 48. When there is no next track associated with the write command, the main controller 22 reads only the track-related information on the write start track (referred to as track i) from the buffer memory 62, and writes such track-related information into the first area Track A.

In S120, the servo controller 44 supplies a seek current or voltage (based on a difference between the current position of the head 32 and the position of the write start sector) to the voice coil motor 34, and performs positioning of the head 32 at the position of the write start sector. The position of the write start sector is based on the CHS information in the track-related information stored in the first area Track A in the memory 48. The voice coil motor 34 rotates according to the seek current or voltage and moves the head 32 to the track at the position of the write start sector (which the write start track).

In S124, the hard disk controller 46 starts to transfer the write data in the buffer memory 62 to the read/write channel 42. Specifically, the hard disk controller 46 reads the first sector data to be written into the track i from the buffer memory 62, generates the CRC code, adds the CHS information and the CRC code to the sector data read from the buffer memory 62, and transfers the result to the work memory 52 in the read/write channel 42. When transferring of the first sector data to be written into the track i to the work memory 52 is finished, the second and subsequent sector data items to be written into the track i and the sector data to be written into the track (i+1) are continuously and sequentially read, and the CHS information and the CRC code are added thereto, and then, sequentially transferred to the work memory 52. The CHS information in the track-related information stored in the first area Track A and the second area Track B in the memory 48 needs to be included in the transfer data to the work memory 52 from the buffer memory 62. In a case where storage of the track-related information in the first area Track A and the second area Track B in the memory 48 becomes unnecessary, the track-related information is updated to new track-related information. However, in a case where the track-related information for the track to be transferred is not recorded in the memory 48 at the time of transferring, the transferring waits until the track-related information is recorded in the memory 48.

When the transfer is completed of the first sector data to be written into the track i to the work memory 52 from the buffer memory 62, the read/write channel 42 starts to encode the sector data in the work memory 52 in S126. Specifically, the read/write channel 42 encodes the first sector data in the track i in the work memory 52 using the error correction code, for example, the LDPC code. The encoding processing may be performed on a per track basis, and is not necessarily limited to being performed on a per sector basis. When encoding of the first sector data in the track i is finished, the sector data for the second and subsequent sectors in the track i and the sector data to be written into the track (i+1) are continuously and sequentially encoded. The encoded sector data is temporarily written into the work memory 52.

When encoding of the data is finished, in S128, the read/write channel 42 starts to write the encoded sector data in the track i on the disk 12. Specifically, the read/write channel 42 writes the first encoded sector data in the track i onto the disk 12 using the head IC 20. After the read/write channel 42 writes the first encoded sector data in the track i on the disk 12, then, continuously and sequentially writes the encoded sector data for the second and subsequent sectors in the track i on the disk 12.

In S132, the hard disk controller 46 determines whether or not all the encoded sector data items in the track i to be written have been written on the disk 12. If No (NO in S132), the process waits in S132, and writing the encoded sector data in the track i on the disk 12 using the head IC 20 in S128 continues.

Once all the encoded sector data in the track i are written on the disk 12 (YES in S132), in S133, the hard disk controller 46 reads the track-related information for the track (i+2) from the buffer memory 62, and writes the information into the first area Track A in the memory 48. In this way, the track-related information for the track (i+2) overwrites the track-related information on the track i in the first area Track A. When the track-related information on the track(i+2) is written into the first area Track A, the hard disk controller 46 reads the sector data to be written into the track (i+1) from the buffer memory 62, and then, sequentially reads the sector data to be written into the track (i+2) from the buffer memory 62, generates the CRC code, adds the CHS information and the CRC code to the sector data read from the buffer memory 62, and then sequentially transfers the result to the work memory 52 in the read/write channel 42. When the transfer of the sector data to be written into the track (i+2) to the work memory 52 is finished, the read/write channel 42 starts to encode the sector data in the work memory 52.

In S134, the servo controller 44 seeks the head 32 to the next track (i+1).

By reversing the order of S133 and S134, the track-related information for the first area Track A in the memory may be updated after seeking is started.

In S136, the read/write channel 42 starts to write the encoded sector data in the track (i+1) on the disk 12. Specifically, the read/write channel 42 writes the first encoded sector data in the track (i+1) on the disk 12 using the head IC 20. After the first encoded sector data in the track (i+1) is written into the disk 12, the read/write channel 42 continues to sequentially write the encoded sector data for the second and subsequent encoded sectors in the track (i+1) onto the disk 12.

In S138, the hard disk controller 46 determines whether or not the writing of all the data of the LBA length designated by the write command is finished. That is, the hard disk controller 46 determines whether or not the LBA length designated by the write command extends over multiple tracks, and when the LBA length does not extend over multiple tracks, determines whether or not there is a non-written track of the multiple tracks remaining. When the writing is finished, that is, when the LBA length designated by the write command does not extend over the more tracks, and or when there are no remaining unwritten tracks when the LBA length designated by the write command extends over the more tracks (YES in S138), the operation ends.

If the writing is not finished (NO in S138), in S140, the hard disk controller 46 determines whether or not all the encoded sector data in the track (i+1) to be written have been written on the disk 12. If No (NO in S140), the process pauses in S140 while writing the encoded sector data in the track (i+1) into the disk 12 using the head IC 20 in S136 continues.

Once all the encoded sector data items in the track (i+1) have been written onto the disk 12 (YES in S140), in S142, the hard disk controller 46 reads the track-related information for the next track (i+3) from the buffer memory 62 and writes the information into the second area Track B in the memory 48. In this way, the track-related information for the track (i+3) overwrites the track-related information for the track (i+1) in the second area Track B. When the track related-information on the track (i+3) is written into the second area Track B, the hard disk controller 46 sequentially reads the sector data to be written into the track (i+3) from the buffer memory 62, generates the CRC code, adds the CHS information and the CRC code to the sector data items read from the buffer memory 62, and then sequentially transfers the results to the work memory 52 in the read/write channel 42. When the transfer of the sector data to be written into the track (i+3) to the work memory 52 is finished, the read/write channel 42 starts to encode the sector data in the work memory 52.

In S144, the micro controller 22 seeks the head 32 to the next track (i+2).

By reversing the order of S142 and S144, the track-related information for the second area Track B in the memory may be updated after seeking is finished.

Subsequently, the encoded sector data for the track (i+2) is written onto the disk 12 in a fashion similar to S136. Whether or not the writing is finished is determined in a fashion similar to S138. Whether or not all the encoded sector data for the track (i+2) have been written onto the disk is determined in a fashion similar to S140. When all the encoded sector data for the track (i+2) have been written onto the disk, the track-related information in one area Track in the memory 48 is updated in a fashion similar to S142 and overwrites the track-related information stored in the track (i+3). These process steps similar to process steps S136, S138, S140, S142, and S144 can be repeated as appropriate.

Successive Writing

By the processing described above, the magnetic disk device in the exemplary embodiments can successively write data to a first track and then to a second track adjacent to the first track.

Figure 6:
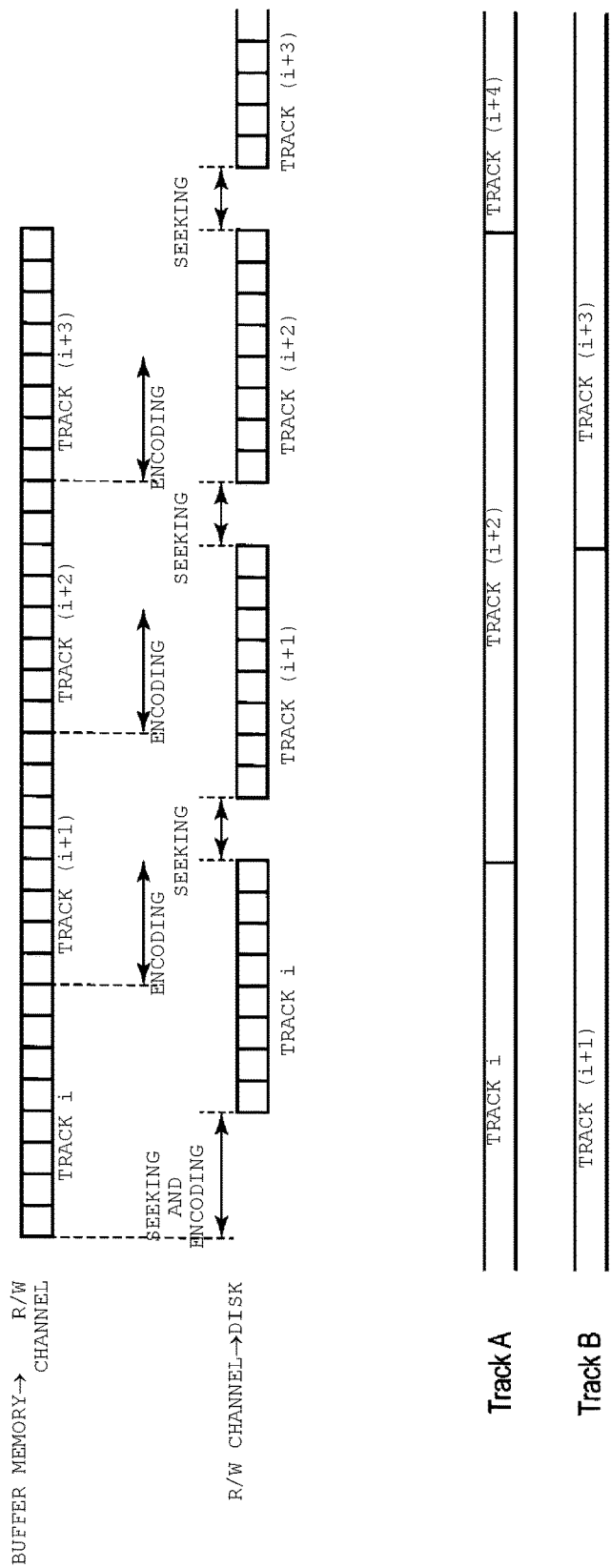
FIG. 6 is a timing chart schematically illustrating an example of successive writes to a plurality of tracks.

FIG. 6 illustrates the sector data transferred to the work memory 52 in the read/write channel 42 from the buffer memory 62, the encoded sector data written into the disk 12 from the work memory 52 in the read/write channel 42, and a state of the track-related information stored in the area Track A and the area Track B in the memory 48 in the hard disk controller 46.

Figure 5:
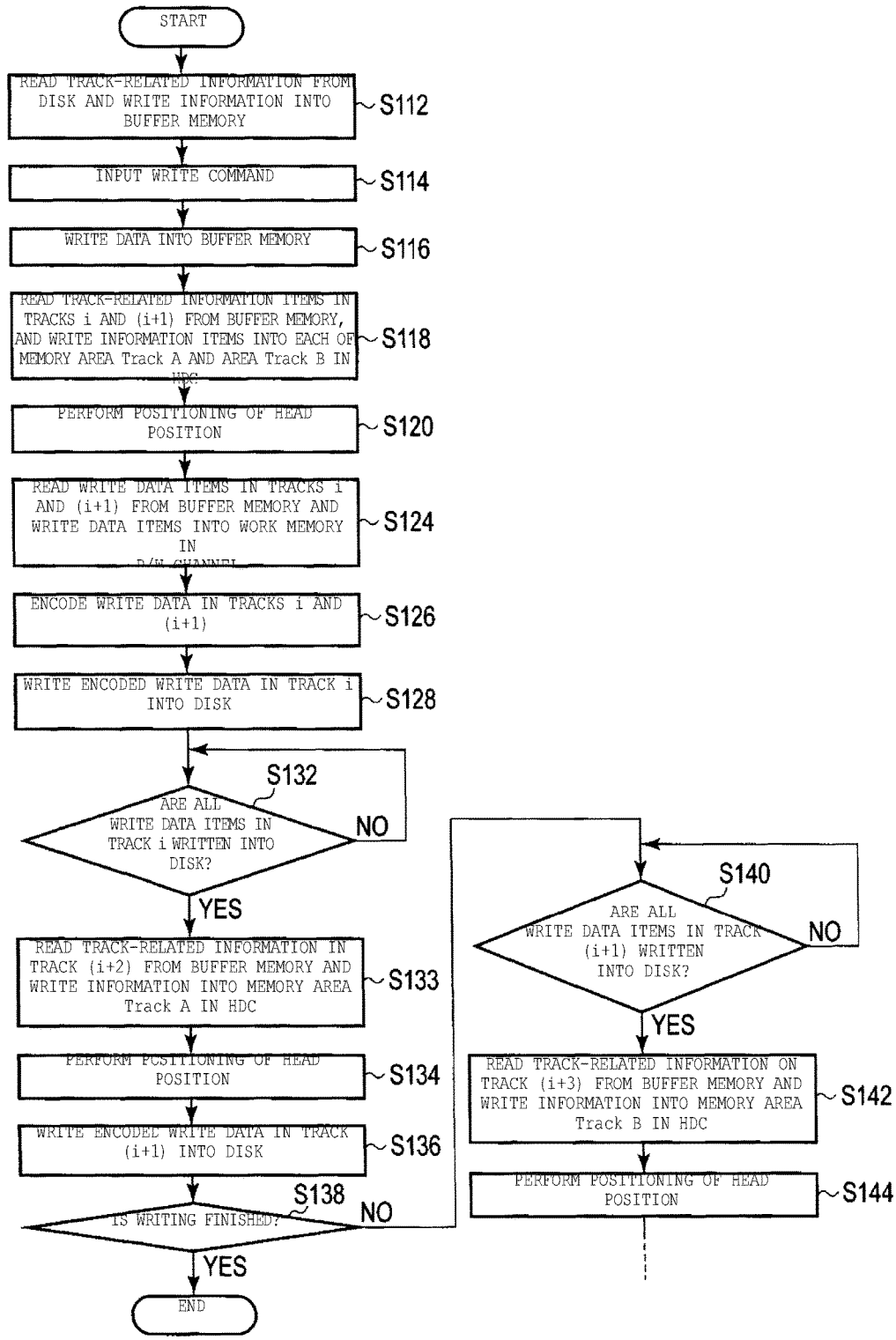
FIG. 5 is a flowchart illustrating an example of a write operation of the magnetic disk device.

In S118 in FIG. 5, the track related information on the track i (which is the write start track) is written into the area Track A in the memory 48, and the track related information on the track (i+1) is written into the area Track B in the memory 48. In S124, the sector data in the track i and the sector data in the track (i+1) are sequentially transferred to the work memory 52 in the read/write channel 42 from the buffer memory 62. The CHS information is also included in the sector data transferred to the work memory 52. In the exemplary embodiments, the CHS information in the track-related information stored in the area Track A and in the area Track B in the memory 48 is added to the sector data transferred to the work memory 52 in the read/write channel 42.

The sector data transferred to the work memory 52 are sequentially encoded using the error correction code in S126. Once the encoding of the first sector data is finished, the encoded sector data in the track i begins to be sequentially written into the disk 12 in S128.

At this time, the first area Track A in the memory 48 in the hard disk controller 46 stores the track-related information on the track i, and the second area Track B stores the track-related information on the track (i+1). Therefore, while the encoded sector data items in the track i are sequentially written onto the disk 12 in S128, it is possible to transfer the sector data in the track (i+1) to the work memory 52 from the buffer memory 62. As described above, while the encoded sector data items in the track i are sequentially written onto the disk 12, it is possible to start to encode the sector data items in the next track (i+1). Therefore, the successive writing of sector data to multiple tracks can be performed with high efficiency.

When all the encoded sector data items in the track i are written into the disk 12, seeking the head 32 to the track (i+1) is started in S134. When all the encoded sector data items in the track i are written into the disk 12, the track-related information for the track i becomes unnecessary, and the track-related information in the first area Track A is updated to the track-related information on the track (i+2).

The encoding of the sector data in the track (i+1) is started when the sector data in the track (i+1) is transferred to the work memory 52. Therefore, by the time seeking the head 32 to the track (i+1) is finished, the encoding of the sector data in the track (i+1) is also finished or at least partially finished. Therefore, once the seeking is finished, the writing of the encoded sector data in the track (i+1) to the disk 12 can be started in S136. As described above, the writing of the encoded sector data to a particular track on the disk 12 is immediately started when seeking to that particular track is finished. Therefore, the successive writing of encoded sector data over multiple tracks can be performed with high efficiency.

More generally, while the encoded sector data in the track j are written onto the disk 12, the memory 48 stores the track related information items for the track j and for the track (j+1). Therefore, encoding of the sector data in the tracks (j+1) and (j+2) can be started while the encoded sector data in the track j are written onto the disk 12. When all the encoded sector data in the track j are written into the disk 12, seeking the track (j+1) is started and the track-related information for the track j is updated to the track-related information for the track (j+2). Therefore, the successive writing over multiple tracks can be performed with high efficiency.

Figure 7:
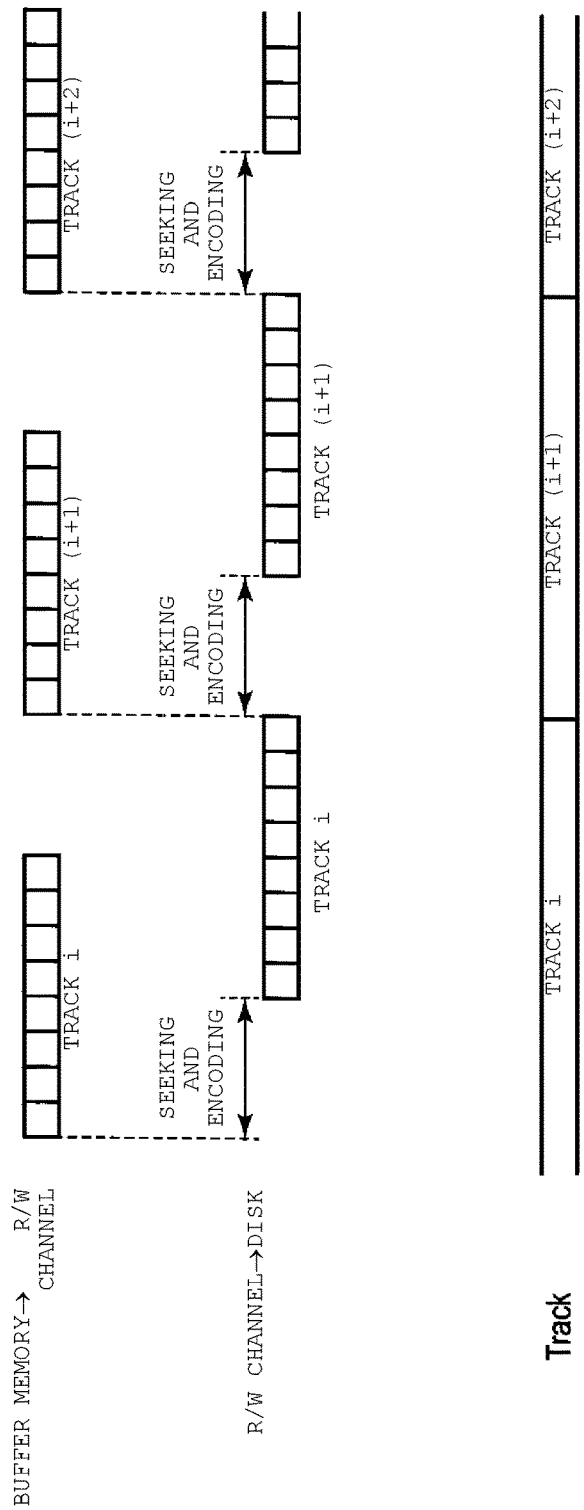
FIG. 7 is a timing chart illustrating a comparison of successive writes to a plurality of tracks.

By way of comparison, the successive writing of sector data onto a plurality of tracks when memory 48 in the hard disk controller 46 stores the track-related information for a single track will be described referring to FIG. 7.

The track-related information is written into the area Track in the memory 48 at a time prior to seeking the head to the track i is started. The sector data in the track i is transferred to the work memory 52 from the buffer memory 62, and encoding thereof is started. After encoding, the encoded sector data in the track i are written onto the disk 12. When all the encoded sector data in track i are written onto the disk 12, the track-related information stored in the area Track in the memory is updated to the track related-information for the track (i+1), and the sector data in the track (i+1) are transferred to the work memory 52 from the buffer memory 62, and then, encoding is started. In addition, when all the encoded sector data items in the track i are written onto the disk 12, seeking the track (i+1) is also started. After encoding and seeking, the encoded sector data for the track (i+1) are written onto the disk 12.

Thereafter, similarly, once all the encoded sector data items in the track (i+1) are written onto the disk 12, updating of the track-related information stored in the area Track in the memory 48, the transferring of the sector data in the next track to the work memory 52, and seeking are performed.

Since the disk 12 rotates, while the head 32 is moved (i.e., seeks) across the tracks by the voice coil motor 34, a sector position of the head 32 changes as the head 32 moves over each track. In order to compensate for this, the position of the first sector is shifted in each track. The shift of the position of the sector is referred to as "skew". If it is assumed that the memory in the hard disk controller 46 includes the area storing the track-related information for only one track, at the time writing, seeking the next track cannot be started until the encoding of all the sector data for one track to be written is finished and written onto the disk 12. In addition, at the time of reading, when encoding methods with high error correction ability are employed, the decoding time is relatively long. Since skewing is dependent on the maximum value of the decoding process time for all the data in one track, when such encoding methods are employed, the skew setting value increases and the speed for successively accessing a plurality of tracks decreases.

According to the present exemplary embodiment, when the encoded sector data for one track is transferred to the read/write channel 42 from the disk 12, it is not necessary to estimate the error correction decoding process time for setting the skew. This is because in the present exemplary embodiment, seeking the head 32 to the next track can be started without waiting for completion of the decoding process for the encoded sector data items. Therefore, the skew setting value can be decreased, and thus, it is possible to shorten the entire process when successively reading or writing tracks.

Since the processing in the present exemplary embodiments can be implemented by a computer program, it is possible to easily realize the effects similar to those in the present exemplary embodiments by installing such a computer program on an MPU included in the read/write channel 43, the hard disk controller 46, and/or the servo controller 44 through a computer-readable storage medium storing the computer program, and by causing the MPU to execute the computer program.

The present invention is not limited to the above-described exemplary embodiments as it is, and configuration described herein can be modified and embodied in practice without departing from the scope thereof. In addition, in some embodiments, various inventions can be formed by appropriately combining multiple embodiments or elements thereof disclosed in the above exemplary embodiments. For example, some elements may be deleted from the exemplary embodiments. Furthermore, in some embodiments, the configuration elements over different exemplary embodiments may be combined as appropriate. Although LDPC encoding has been described as an encoding method, other encoding methods may be used in some embodiments. In addition, the content of the track-related information is not limited to that in the above description, and various modifications can be used in some embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the scope of the inventions. The accompanying claims and their equivalents are intended to cover such forms or modifications as would fall within the scope and spirit of the inventions.

What is claimed is:

1. A magnetic disk device comprising:
   a magnetic disk that includes a plurality of tracks;
   a magnetic head for reading data from the magnetic disk; and
   a controller that begins controlling the magnetic head to move to a second track of the plurality of tracks from a first track of the plurality of tracks before decoding of a first track signal output from the magnetic head is completed, wherein the first track signal is output from the magnetic head while the magnetic head is positioned over the first track.

2. The device according to claim 1, further comprising:
   a first storage unit that stores first information for causing the magnetic head to access the first track; and
   a second storage unit that stores second information for causing the magnetic head to access the second track, wherein the controller
   performs a decoding process on the first track signal based on the first information stored in the first storage unit to generate decoded sector data,
   begins controlling the magnetic head to move to the second track based on the second information stored in the second storage unit, and
   after storing the decoded sector data in a third storage unit, updates the first information stored in the first storage unit with third information for causing the magnetic head to access a third track of the plurality of tracks.

3. The device according to claim 2, wherein updating the first information stored in the first storage unit with the third information comprises overwriting the first information with the third information.

4. The device according to claim 1, further comprising:
   a first semiconductor memory that stores first information for positioning the magnetic head to the first track and second information for positioning the magnetic head to the second track; and
   a second semiconductor memory having a processing speed higher than the first semiconductor memory,
   wherein the controller
   reads the first information from the first semiconductor memory and writes the first information into the second semiconductor memory,
   reads the second information from the first semiconductor memory and writes the second information into the second semiconductor memory, so that the second semiconductor memory stores the first information and the second information simultaneously,
   performs a decoding process on the first track signal output from the magnetic head based on the first information stored in the second semiconductor memory to generate decoded sector data, and
   during the decoding process, controls the magnetic head to move to the second track based on the second information stored in the second semiconductor memory.

5. The device according to claim 4, further comprising:
   a buffer memory that stores a signal output from the magnetic head,
   wherein the controller writes the first track signal output from the magnetic head into the buffer memory during a period in which the first information and the second information are stored in the second semiconductor memory, and, while the magnetic head moves to the second track based on the second information stored in the second semiconductor memory, writes the decoded sector data stored in the buffer memory into the first semiconductor memory.

6. The device according to claim 5, wherein the controller overwrites the first information stored in the second semiconductor memory with third information for controlling the position of the magnetic head to a third track while a second track signal output from the magnetic head is written into the buffer memory, wherein the second track signal is output from the magnetic head while the magnetic head is positioned over the second track, and controls the magnetic head to move to the third track after the third information is written into the second semiconductor memory.

7. The device according to claim 4,
wherein the controller
encodes write data for the first track based on the first information stored in the second semiconductor memory, and
encodes the write data for the second track based on the second information stored in the second semiconductor memory.

8. The device according to claim 1,
wherein the first information and the second information each include a cylinder number, a head number, and a sector number.

9. A method carried out in a magnetic disk device, the magnetic disk device including a magnetic disk including a plurality of tracks, and a magnetic head for reading data from the magnetic disk, the method comprising:
starting a decoding process on a first track signal output from the magnetic head while the magnetic head is positioned over a first track of the plurality of tracks, and
starting to move the magnetic head to a second track of the plurality of tracks before completion of the decoding process.

10. The method according to claim 9, further comprising:
writing first information for causing the magnetic head to access the first track into a first storage unit;
writing second information for causing the magnetic head to access the second track into a second storage unit;
performing the decoding process on the first track signal output from the magnetic head based on the first information stored in the first storage unit to generate decoded sector data;
begin moving the magnetic head to the second track based on the second information stored in the second storage unit; and
after storing the decoded sector data in a third storage unit, updating the first information stored in the first storage unit with third information for causing the magnetic head to access a third track of the plurality of tracks.

11. The method according to claim 9, further comprising:
writing first information for controlling the position of the magnetic head to the first track and second information for controlling the position of the magnetic head to the second track into a first semiconductor memory;

reading the first information from the first semiconductor memory and reading the second information read from the first semiconductor memory into a second semiconductor memory having a processing speed higher than the first semiconductor memory;
performing the decoding process based on the first information stored in the second semiconductor memory; and
moving the magnetic head to the second track based on the second information stored in the second semiconductor memory.

12. The method according to claim 11, further comprising:
writing the first track signal output from the magnetic head into a buffer memory while the first information and the second information are stored in the second semiconductor memory, and writing the decoded sector data stored in the buffer memory into the first semiconductor memory while the magnetic head moves to the second track based on the second information stored in the second semiconductor memory.

13. The method according to claim 12, further comprising
while a second track signal output from the magnetic head is written into the buffer memory, overwriting the first information stored in the second semiconductor memory with third information for controlling the position of the magnetic head to a third track, wherein the second track signal is output from the magnetic head while the magnetic head is positioned over the second track; and
moving the magnetic head to the third track after the third information is written into the second semiconductor memory.

14. The method according to claim 13, further comprising:
encoding write data for the first track based on the first information stored in the second semiconductor memory; and
encoding the write data for the second track based on the second information stored in the second semiconductor memory.

15. A controller that can be connected to a magnetic disk device, comprising:
a decoding circuit that performs a decoding process on a signal output from a magnetic head; and
a first storage unit that stores first information based on which the magnetic head is moved to access a first track of a plurality of tracks in the magnetic disk device; and
a second storage unit that stores second information based on which the magnetic head is moved to access a second track of the plurality of tracks that is adjacent to the first track,
wherein the controller starts to control the magnetic head to move to the second track based on the second information stored in the second storage unit while the decoding circuit performs the decoding process.

16. The controller according to claim 15, wherein the controller is configured to store decoded sector data generated by the decoding process in a third storage unit while the magnetic head moves from the first track to the second track based on the second information stored in the second semiconductor memory.

17. The controller according to claim 16,
wherein the controller is configured to, after storing the decoded sector data in the third storage unit, update the first information stored in the first storage unit with third information for causing the magnetic head to access a third track of the plurality of track.

18. The controller according to claim 17, wherein updating the first information stored in the first storage unit with the third information comprises overwriting the first information with the third information.

19. The controller according to claim 17, further comprising:
a buffer memory that stores a signal output from the magnetic head,
wherein the controller
writes the first track signal output from the magnetic head into the buffer memory during a period in which the first information is stored in the first storage unit and the second information are stored in the second storage unit, and writes the decoded sector data stored in the buffer memory into the first semiconductor memory while the magnetic head moves to the second track based on the second information stored in the second semiconductor memory.

20. The controller according to claim 19, wherein the controller
overwrites the first information stored in the second storage unit with third information for causing the magnetic head to access a third track while a second track signal output from the magnetic head is written into the buffer memory, wherein the second track signal is output from the magnetic head while the magnetic head is positioned over the second track, and
controls the magnetic head to move to the third track after the third information is written into the second storage unit.

* * * * *